United States Patent [19]
Soljanin

[11] Patent Number: 5,608,397
[45] Date of Patent: Mar. 4, 1997

[54] METHOD AND APPARATUS FOR GENERATING DC-FREE SEQUENCES

[75] Inventor: Emina Soljanin, Summit, N.J.

[73] Assignee: Lucent Technologies Inc., Murray Hill, N.J.

[21] Appl. No.: 515,445

[22] Filed: Aug. 15, 1995

[51] Int. Cl.$^6$ .................................................. H03M 7/00
[52] U.S. Cl. ................. 341/58; 341/50; 341/95; 360/40
[58] Field of Search ................. 341/58, 50, 95, 341/106; 360/39, 40

[56] References Cited

U.S. PATENT DOCUMENTS

| | | | |
|---|---|---|---|
| 4,833,471 | 5/1989 | Tokuume et al. | 341/67 |
| 5,016,258 | 5/1991 | Tanaka et al. | 375/25 |
| 5,196,848 | 3/1993 | Sakazaki et al. | 341/58 |
| 5,198,813 | 3/1993 | Isozaki | 341/59 |
| 5,341,134 | 8/1994 | Benjauthrit | 341/58 |
| 5,355,133 | 10/1994 | Shimpuku et al. | 341/58 |
| 5,438,621 | 8/1995 | Hornak et al. | 380/43 |
| 5,450,443 | 9/1995 | Siegel et al. | 375/286 |
| 5,451,943 | 9/1995 | Satomura | 341/58 |
| 5,469,162 | 11/1995 | Chaki et al. | 341/58 |
| 5,477,222 | 12/1995 | Kahlman et al. | 341/95 |
| 5,508,701 | 4/1996 | Nose et al. | 341/58 |

OTHER PUBLICATIONS

R. Karabed et al., "Matched Spectral–Null Codes for Partial–Response Channels," *IEEE Transactions on Information Theory*, vol. 37, No. 3, 818–855 (May 1991).

L. Fredrickson et al., "Improved Trellis–Coding for Partial–Response Channels," *IEEE Transactions on Magnetics*, vol. 31, No. 2, 1141–1148 (Mar. 1995).

K. J. Knudson et al., "A Concatenated Decoding Scheme for (1–D) Partial Response with Matched Spectral–Null Coding," *Proc. 1993 IEEE Global Telecomm. Conf. (GLOBECOM '93)*, 1960–1964 (Nov. 1993).

*Primary Examiner*—Jeffrey A. Gaffin
*Assistant Examiner*—Jason L. W. Kost
*Attorney, Agent, or Firm*—Katharyn E. Olson

[57] ABSTRACT

A method and apparatus generates a channel codeword based on codewords with arbitrary block digital sums. Respective portions of the channel codeword are generated based on respective sets of input symbols, and the channel codeword is generated from the portions in accordance with another set of input symbols. The potions are advantageously codewords, comprising symbols, generated by selecting, for each set of input symbols, a codeword from a codebook and by adapting, as for example by ordering or by inverting symbols in, the codewords to form the channel codeword.

50 Claims, 5 Drawing Sheets

METHOD AND APPARATUS FOR GENERATING DC-FREE SEQUENCES

TECHNICAL FIELD

The invention relates to a field of coding for digital systems.

BACKGROUND OF THE INVENTION

Information (e.g., signals representing voice, data, video, text, or encoded versions thereof) must typically be processed before the information can be transmitted over a communications channel or recorded on a medium. First, the information, if not already in digital form, is digitized, as for example by an analog-to-digital converter whereby the information is represented as symbols comprising elements from a set of binary digits or bits, {0,1}. Next, the digitized information may be optionally be compressed to represent the information in a reduced number of symbols. Any reduction in the number of symbols representing the information may be partially offset if the compressed information is processed using error correcting codes. Error correcting codes introduce additional symbols to a signal (e.g. to a digital representing compressed information) to form an encoded signal. In particular, an error correcting code operates on groups of symbols, called information words, in the signal. Each information word is used to generate, according to a prescribed error correcting coding rule, a codeword comprising a larger group of symbols. See e.g., Shu Lin and Daniel J. Costello, Jr., *Error Control Coding*, Prentice Hall, Englewood Cliffs, N.J., 1983. The encoded signal, comprising the codewords, may then be either transmitted over the communications channel or recorded on a medium. In either case, the encoded signal will be corrupted by noise introduced in the transmission or recording process, such as by atmospheric noise (caused by lightening) on radio channels. The additional symbols introduced by the error correcting codes improve the ability of a system receiving the corrupted encoded signal to recover the compressed information.

Importantly, an additional or further kind of coding, termed modulation coding, is often used to process information (such as the encoded signal generated using the error correcting codes) before transmission over a channel or recording on a medium. In particular, modulation coding advantageously transforms a group of input symbols (such as a group of symbols which comprises a codeword generated by an error correcting code) and generates a channel or modulation codeword which channel codeword comprises a larger number of symbols than the number of symbols in the group of input symbols. As with error correcting codes, modulation coding can improve a system's immunity to noise. Perhaps more importantly, modulation codes can advantageously be used to regulate time parameters (e.g. for controlling oscillator or counting circuits) and to regulate gain parameters (e.g. for amplifier circuits) in recording and communications systems as explained below.

Modulation coding may be implemented, for example, by establishing, for each possible combination of input symbols in a group, a one-to-one mapping between the group and a corresponding channel codeword. In short, each combination of input symbols uniquely specifies a channel codeword and vice versa. Such a mapping may be established by taking a group of input symbols and using it as an address of a memory device (such as a read only memory or a random access memory) where the contents of the address are the symbols comprising the channel codeword. The memory device is referred to as a codebook. The particular group of input symbols may be obtained or decoded from the channel codeword by using, for example, an inverse codebook where a channel codeword is an address of a location in a memory device where the contents of the address are the group of symbols corresponding to the channel codeword.

Consider a system which records information on a magnetic medium and in which a channel codeword comprising a sequence of seven binary digits "1010001" is to be represented on the magnetic medium. The binary sequence is advantageously used to modulate or control the flow of an electrical current in one of two opposite directions. The current in turn, produces a magnetic field the direction of which magnetic field is in one of two opposite directions depending on the direction of the current. In particular, transitions from one direction in the current (and consequently in the magnetic field) to the other, correspond to binary "1's" in the sequence. Thus, assuming the electrical current and corresponding magnetic field are established in respective "initial" directions, the first "1" in the sequence of seven binary digits would cause the current and corresponding magnetic field are established to transition or switch to the opposite directions. The current and corresponding magnetic field would remain in the opposite direction during the first "0" in the sequence of seven binary digits. The third binary digit, which is a "1", causes the current and magnetic field to revert or transition back to their initial directions where they remain for the next three digits in the sequence of seven binary digits, i.e., the "0's" cause no change in the direction of magnetization. The seventh digit in the sequence is a "1" which causes the current and corresponding magnetic field to transition to the opposite directions.

To represent the seven digit binary sequence on the magnetic medium, the magnetic medium is divided into portions with each portion corresponding to a particular digit in the binary sequence. Each portion of the magnetic medium is, in turn, exposed to the magnetic field produced according to its corresponding bit in the channel codeword, and is consequently magnetized by the field in one of the two directions. The information recorded on the medium is termed a channel sequence and is defined by the channel codeword. The channel sequence comprises channel symbols, but unlike the symbols in the information and channel codewords described above, the channel symbols in a channel sequence for a magnetic medium are advantageously selected from a set of bipolar symbols, {−1,1}, which set of symbols more closely reflects the physical manifestation of the channel sequence on the medium in which the portions are magnetized with equal (i.e. unit) intensity in one of two (i.e. bi-) opposite (i.e. polar) directions.

The channel codeword which defined the channel sequence is read by detecting a change in a voltage signal caused by: 1) changes in the magnetization of portions of the medium and 2) by noise in the system. The voltage signal is a pulse each time a "1" is detected and just noise each time a "0" is detected. The position of the pulses carries information about timing parameters in the system, and the height of the pulses carries information about gain parameters in the system. Importantly, however, if a long string of "0's" are read, there is no voltage output (other than noise), and hence no timing or gain information, thereby leading to a loss of, or drift in, timing and gain parameters.

Thus, modulation coding schemes which advantageously avoid the recording or transmission of long strings of binary zeros in channel codewords may be used to ensure accurate timing and gain information.

In addition to ensuring accurate timing and gain information, modulation coding may also advantageously be used to generate a signal comprising "dc-free" channel sequences. More particularly, it is often desirable that channel sequences have a spectral null at zero (dc) frequency by which it is meant that the running digital sum (i.e. the arithmetic sum) of all the symbols transmitted in the sequence over a channel or recorded on a medium is bounded. Such sequences are said to be dc-free, and such sequences are desirable because they may provide even further noise immunity. One way to assure a dc-free sequence is to design a system in which the block digital or the arithmetic sum of symbols in a channel sequence transmitted over a channel is zero. However, efficient or high rate modulation codes, i.e., codes that can prevent long strings of zeros from occurring without adding an excessive number of symbols to the information to be recorded, that also define dc-free channel sequences, typically require complex circuitry to implement and often require large power consumption and large area on integrated circuits relative to other elements in the transmission or recording system. Similarly, systems for decoding such high rate modulation codes are also relatively complex. Thus, there is a need for an improved method and apparatus for encoding and decoding information using high rate codes that advantageously are dc-free.

SUMMARY OF THE INVENTION

In accordance with the present invention it is recognized that a channel codeword, comprising a given number of symbols and that advantageously is dc-free, may be generated based on non-dc-free codewords comprising a smaller number of symbols thereby reducing implementation complexity for generating such a channel codeword. Accordingly, a method and apparatus generate a channel codeword by selecting, for each set of input symbols in a plurality of sets of input symbols, a respective codeword, and by generating the channel codeword based on the selected respective codewords and on an additional set of input symbols, the channel codeword advantageously defining a channel sequence with a block digital sum of zero. In one embodiment, the channel codeword comprises two codewords, which two codewords were selected by respective set of input symbols, where the two codewords define respective channels sequences having block digital sums that are inverses of each other and where the ordering of the two codewords in the channel codeword is determined by an additional set of input symbols. In another embodiment, the channel codeword comprises two codewords, which two codewords were selected by respective sets of input symbols, where the two codewords define respective channels sequences having identical block digital sums and where, based on an additional set of input symbols, the symbols in, and thus the block digital sum of, one of the two codewords are inverted.

DETAILED DESCRIPTION

Figure 1:
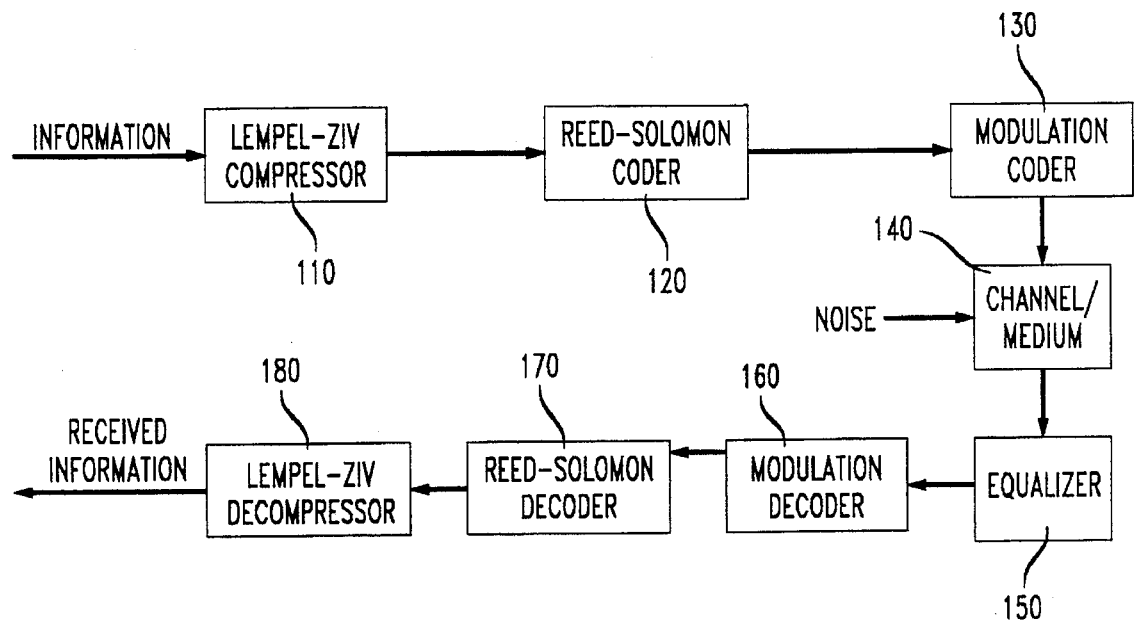
FIG. 1 is a block diagram of a system in which in the inventive method may be practiced.

FIG. 1 is a block diagram of a system in which the inventive method may be practiced. In particular, the system of FIG. 1 is useful for recording and reading information via a magnetic medium such as digital audio tape and disk drives.

The information is first advantageously compressed using Lempel-Ziv compressor 110 so as to reduce the amount of information that must be recorded on the medium thereby saving time and money (e.g. by permitting additional information to be recorded on a given amount of recording medium or be requiring less of the medium for holding a given amount of information). Next, the compressed information is advantageously input to encoder 120 which encodes the compressed information using Reed-Solomon codes. The purpose of Reed-Solomon encoding is to introduce extra information into the compressed information to reduce errors introduced in the reading process. Lempel-Ziv and Reed-Solomon encoding are described in greater detail in Timothy C. Bell et al., *Text Compression*, Prentice-Hall, Englewood Cliffs, N.J., 1990 and S. Lin and D. J. Costello, *Error Control Coding*, Prentice-Hall, Englewood Cliffs, N.J., 1983, respectively.

The output of encoder 120 is a series of symbols where each symbol is represented by a set of one or more bits. The symbols are input to modulation coder 130 which generates an N-symbol codeword defining a channel sequence that is transmitted through channel or recorded on medium 140.

The channel sequence is received in equalizer 150 which compensates for distortions (e.g. in frequency and phase) introduced in channel 140. Modulation decoder 160 and Reed-Solomon decoder 170 reverse the encoding processes of modulation encoder 130 and Reed-Solomon encoder 120, respectively. The information is then recovered by decompressing in Lempel-Ziv decompressor 180 the output of Reed-Solomon decoder 170.

Recall that it is often advantageous that a channel sequence have a spectral null at zero (dc) frequency. It has been shown that the power density function of a channel sequence x comprising symbols $x_j$, (i.e. $x = \ldots x_{-1}, x_0, x_1, \ldots$), vanishes at zero frequency if and only if its running-digital-sum (RDS), defined as $$RDS_i = \sum_{j=-\infty}^{i} x_j$$

is bounded. It is known how to encode sequences of arbitrary symbols into channel sequences with bounded RDS's by means of dc-free modulation codes which codes may be finite-state codes or block codes. However, such encoding techniques are complex and require extensive circuitry to implement. See, R. Karabed and P. H. Siegel, "Matched spectra-null codes for partial response channels," *IEEE*

Trans. Inf. Theory, Vol. 28, No. 2, pp. 435–439, March 1991; K. J. Knudson, J. K. Wolf and L. B. Milstein, "A concatenated decoding scheme for (1-D) partial response with matched spectral-null coding," Proc. 1993 IEEE Global Telecomm. Conf. (GLOBECOM '93), Houston, Tex., pp. 1960–1964, November 1993.

Finite state codes are those in which the coded output depends on both the current input and the current state of the coder where the current state is, in turn, a function of prior inputs. Block codes, on the other hand, take blocks of M symbols, called information words, and map them into blocks of N channel symbols called codewords. Several factors favor the use of block codes. One such factor is limited error propagation since the block codes encode without memory, i.e. the symbols used to encode one block are not used in encoding any other block and thus errors in encoding are typically confined to a particular block. Another factor is ease of implementation. The simplest way to organize a one-to-one mapping of information words to codewords is to form a codebook of $2^M$ codewords and use an M-symbol input word to specify an N-symbol codeword in the codebook. The ratio M/N defines the rate R of the modulation code. Note that when decoding a received codeword, the M-symbol information word may be recovered, for example, by inverting the mapping or by combinatorial logic circuits in an inverse codebook.

One way to ensure that an arbitrary sequence of codewords has a bounded RDS, each codeword $w = w_1, w_2, \ldots w_N$ is required to have a block digital sum (BDS), defined as $$BDS = \sum_{j=1}^{N} w_j$$

equal to zero. Codewords defining sequences of bipolar symbols, e.g. codewords with bipolar symbols +1 and −1, with BDS equal to zero are possible only if the codeword length N is even and if half the symbols are −1 and half the symbols are +1. The number of such codewords is then equal to $$\binom{N}{N/2}.$$

Note, however, that at most $2^M$ codewords defining sequences with BDS zero can be used to form a codebook for an M/N rate code, where $$M = \text{floorlog}\binom{N}{N/2},$$

and where the function floor(x) returns the largest integer less than or equal to x.

The above explanation is rendered more clear by use of a specific example. Consider the block length N of a sequence to be 4. There are 16 possible sequences of symbols as shown in Table 1 below, and 6 of these sequences are dc-free as indicated by the asterisks. Note, however, that since the number of codewords in a codebook is advantageously a power of 2, the codebook of length N in this example will be four, and two of the dc-free codewords in Table 1 will not be used thereby lowering the code rate. Table 2 below lists the codebook size and maximum code rate for different values of N where N is a dc-free sequence. Note that in some cases the requirement that $$M = \text{floorlog}\binom{N}{N/2},$$

causes a substantial number of extra dc-free sequences not to be used. For example, if N=8, then the number of DC free sequences is 70, the code rate is 0.75 with the codebook of size 64, and 6 dc-free sequences are not used. However, if N=10 there are 252 possible dc-free sequences. The codebook is of size 128, and 124 sequences are discarded thereby lowering the code rate to 0.70.

In some applications, e.g. in magnetic recording applications, it is advantageous that modulation codes have rates higher than 3/4 so that a large percentage of the channel sequence represents information and a small portion represents coding. According to Table 2 below, large block length codes and large codebooks are typically required for rates above 3/4. For example, a code of rate 11/14 requires a block length of 14 and a codebook size of 2048 codewords, and a code of rate 13/16 requires a block length of 16 and a codebook of size 8192 codewords. Large codebook size is typically not an advantage when implementing coders since large codebooks require both more time to access codewords stored in the codebooks and more space in an integrated circuit than smaller codebooks. Although some schemes have been proposed to reduce the size of codebooks while maintaining the rate of a given code, these techniques add additional complexity and do not substantially reduce the size of the codebooks.

In accordance with the present invention a coding scheme is proposed which may advantageously reduce the codebook size for a given code rate. The inventive method recognizes that in prior block coding techniques used to generate dc-free modulation codes, each codeword in a codebook was required to define a sequence having a BDS equal to zero to ensure that an arbitrary sequence of codewords had a bounded RDS. In the inventive method, however, information words are applied to modulation coder to select codewords defining sequences with arbitrary or non-restricted BDS. The selected codewords will then be used to generate an output codeword which advantageously defines a dc-free sequence.

Figure 2:
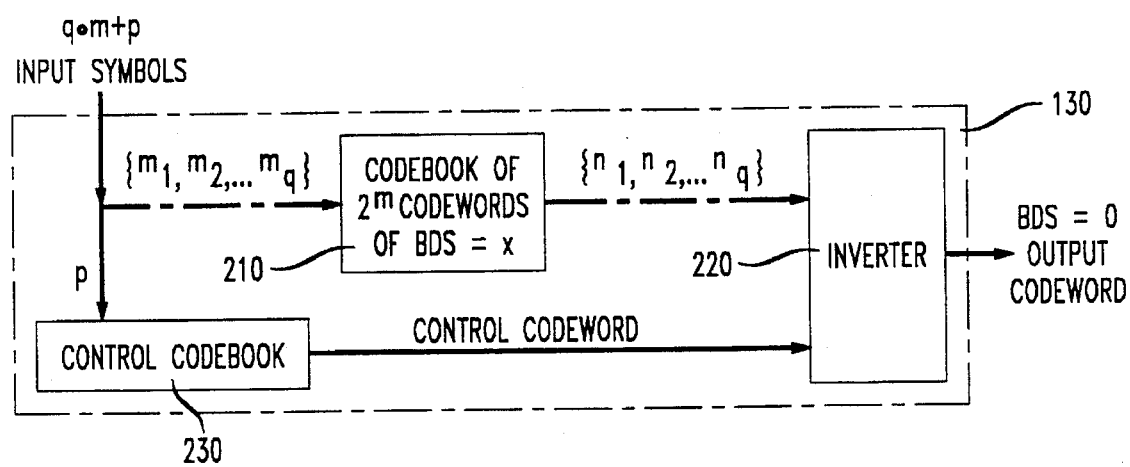
FIG. 2 is a block diagram of a first embodiment of a system for generating dc-free sequences.

FIG. 2 illustrates a first embodiment of the inventive method for generating dc-free sequences. In this embodiment q groups of information words of m symbols and a group of p symbols are input to modulation coder 130. Each group of m input symbols is used to select an n symbol codeword from codebook 210. Codebook 210 advantageously comprises $2^m$ codewords where the BDS of the symbols in the sequence defined by each codeword is x. Codebook 210 is advantageously implemented in a memory device such as read only memory or random access memory. The codewords selected by the set of input symbols $\{m_1, m_2, \ldots m_q\}$ are $\{n_1, n_2, \ldots n_q\}$ respectively. The group of p input symbols are input to control codebook 230 which contains $2^p$ codewords defining sequences of bipolar symbols of length q where each sequence has a BDS of zero. The group of p symbols selects a codeword, termed a control codeword, from control codebook 230 which is then input, along with the set of codewords $\{n_1, n_2, \ldots n_q\}$ to inverter 220. Each of the q codewords is associated with one of the q symbols in the control codeword. Inverter 220 inverts the symbols in half of the codewords according to associated symbol in the control word. Thus after inversion, half of the codewords define a sequence with a BDS of x, and half a BDS of −x, and the output codeword (i.e. the group of codewords $\{n_1, n_2, \ldots n_q\}$ as processed by inverter 220) defines a sequence with a BDS of zero.

To illustrate the above example in a specific context using the inventive method, consider the rate 11/14 code of Table 2 which in prior techniques requires a codebook of size 2048 codewords. In the inventive method as illustrated in FIG. 2, a single codebook (i.e. codebook 210 in FIG. 2) of 7-symbol codewords defining sequences with BDS equal to +1 may be used (e.g. 4 of the symbols in the sequence are +1, and 3 of the symbols are −1). There are $$\binom{7}{3} = 35$$

such codewords defining sequences with BDS=1, and $32=2^5$ of the codebook are selected for codebook 210. Note that if the sign of each symbol of a codeword in the codebook is inverted, the resulting inverted codeword defines a sequence with a BDS equal to −1. Thus, a rate 11/14 dc-free code can be generated using the method of FIG. 2, as follows. The 11 input symbols are divided into q=2 groups of m=5 symbols and another group of p=1 symbol. The first and second groups of m=5 symbols select respective 7-symbol codewords in codebook 210. The p=1 symbol specifies which of the two selected codewords is to have its symbols inverted in inverter 220 thereby yielding a dc-free output codeword comprising a 7-symbol sequence of BDS=+1 and a 7-symbol sequence of BDS=−1. More formally, the p=1 input symbol can be used to select one of two codewords, either the codeword defining the sequence (−1,1) or the codeword defining the sequence (1,−1), in control codebook 230 as the control word where (−1,1) indicates the symbols of the first 7-symbol codeword are inverted and where (1,−1) indicates the symbols of the second 7-symbol codeword are inverted.

The implementation of FIG. 2 can be used in a variety of contexts. For example, the BDS of sequences defined by codewords in codebook 210 need not be +1. The BDS may be any value as long as $2^m$ entries are available for codebook 210.

Figure 3:
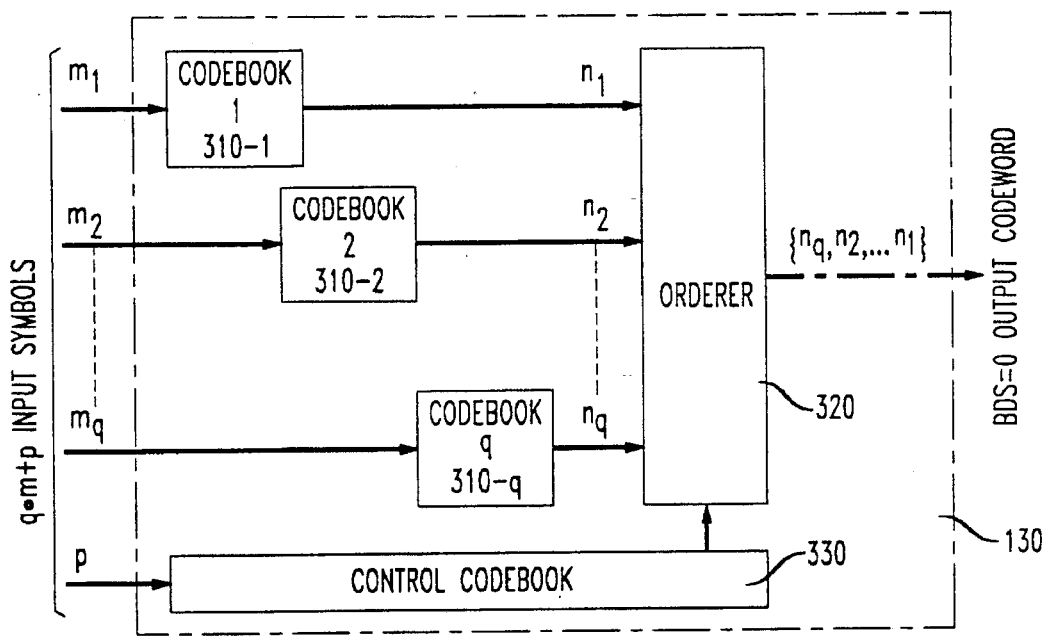
FIG. 3 is a block diagram of a second embodiment of a system for generating dc-free sequences.

Another embodiment of the present invention is illustrated in FIG. 3 where q groups of m symbols and a group of p symbols are input to modulation coder 130. Each group of m input symbols is used to select a codeword from a respective codebook 310-j, j=1,2, . . . q. Codebook 310-j advantageously comprises $2^m$ codewords where all codewords in codebook 310-j define sequences with the same BDS, i.e. $BDS_j$. Further, $$\sum_{j=1}^{q} BDS_j = 0.$$

The group of p input symbols are input to control codebook 330 which contains $2^p$ codewords of length q where the control codebook comprises codewords defining sequences with a BDS of zero. The group of p symbols selects a control codeword from control codebook 330 which is input, along with the selected codewords $\{n_1, n_2 \ldots n_q\}$ to orderer 320. Orderer 320 orders or concatenates the codewords according to a rule prescribed by the p symbols, e.g. the output of orderer 320 is $\{n_q, n_2, \ldots n_1\}$. Thus, since one codeword is selected from each codebook and since $$\sum_{j=1}^{q} BDS_j = 0,$$

the output codeword generated by the system in FIG. 3 defines a sequence with BDS=0.

To illustrate the second embodiment in a specific example, again consider the rate 11/14 code of Table 2. In the second embodiment, two codebooks, 310-1 and 310-2 are used. Codebook 310-1 contains thirty-two 7-symbol codewords defining sequences with BDS equal to +1. Codebook 310-2 contains thirty-two 7-symbol codewords defining sequences with BDS equal to −1. The rate 11/14 dc-free code can be generated using the method and apparatus of FIG. 3 as follows. The 11 input symbols are divided into two groups of five symbols and another group of one symbol. Each group of five symbols selects a codeword from a respective codebook. The single symbol specifies which of the two selected codewords is to be output first by orderer 320 thereby yielding a dc-free output codeword defining a channel sequence comprising a 7-symbol sequence of BDS=+1 and a 7-symbol sequence of BDS=−1.

The implementation of FIG. 3 can be expanded and is not limited by the examples given above. For example, the BDS of sequences defined by codewords in codebooks 310-j need not be +1 and −1. All that is required is that $$\sum_{j=1}^{q} BDS_j$$

is zero. Thus, a set of four codebooks defining sequences with $BDS_1=3$, $BDS_2=1$, $BDS_3=-1$ and $BDS_4=-3$ is suitable.

Figure 4:
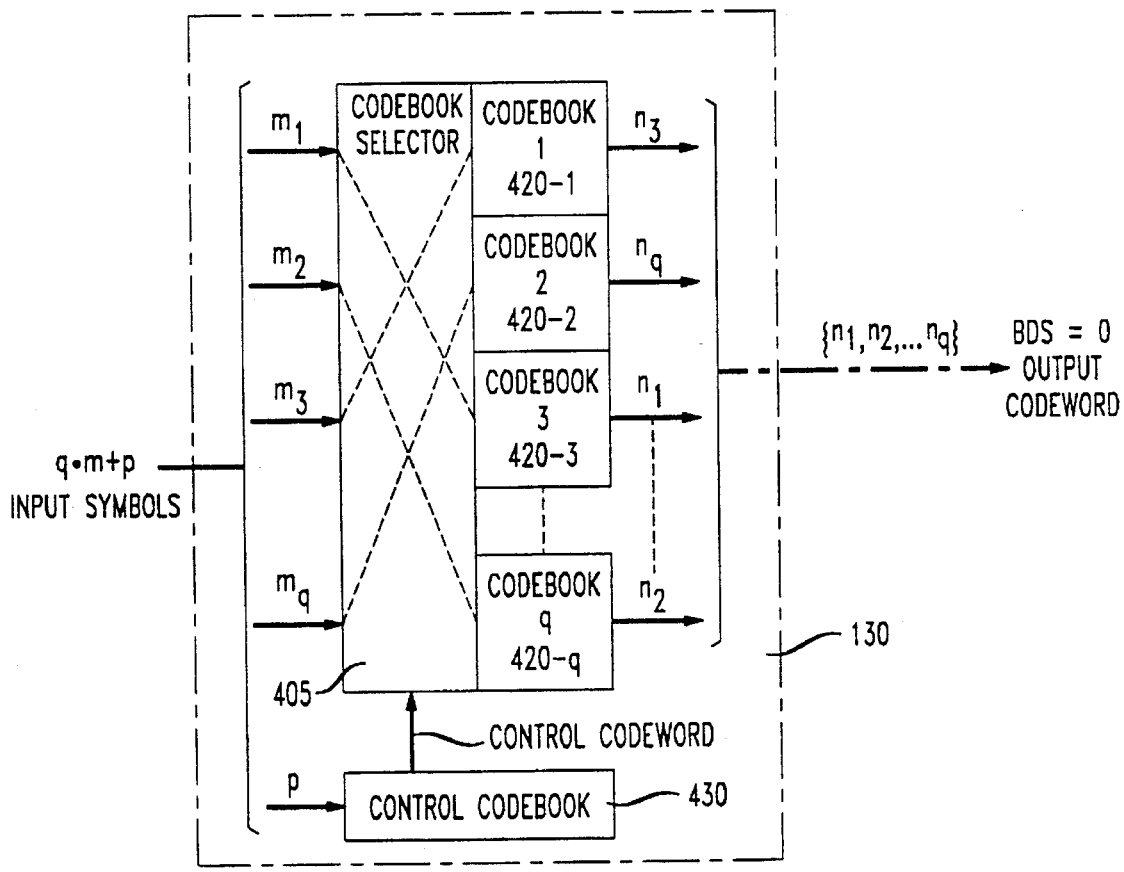
FIG. 4 is a block diagram of a third embodiment of a system for generating dc-free sequences.

FIG. 4 illustrates a third embodiment of the inventive method for generating dc-free sequences. In this embodiment q groups of m symbols and a group of p symbols are input to modulation coder 130. Each group of m symbols is used to select a codeword from codebook 420-j where the particular codebook selected for a given set of m symbols is determined by the set of p symbols. In particular, the set of p symbols is advantageously used to select a control codeword from control codebook 430 which control codeword is input to codebook selector 405. Codebook selector 405 then routes each set of m symbols to the proper codebook 420-j from which a respective codeword is then selected. As with embodiment of FIG. 3, if the $j^{th}$ codebook comprises codewords defining sequence with $BDS_j$, and if $$\sum_{j=1}^{q} BDS_j = 0,$$

then the output codeword generated by modulation coder 130 defines a sequence that is dc-free.

In the context of the rate 11/14 code discussed above, two groups of 5 input symbols and another single input symbol can be input to modulation coder 130. Two codebooks, 410-1 and 410-2 of thirty-two 7-symbol codewords defining sequences with BDS+1 and −1, respectively, are used. The single symbol p is used to decide which group of 5 input symbols uses codebook 410-1 with the other group of 5 input symbols selecting a codeword from codebook 410-2. The resulting output codeword, based on a codeword selected from codebook 410-1 and a codeword from codebook 410-2, will define a channel sequence with a BDS of zero.

Figure 5:
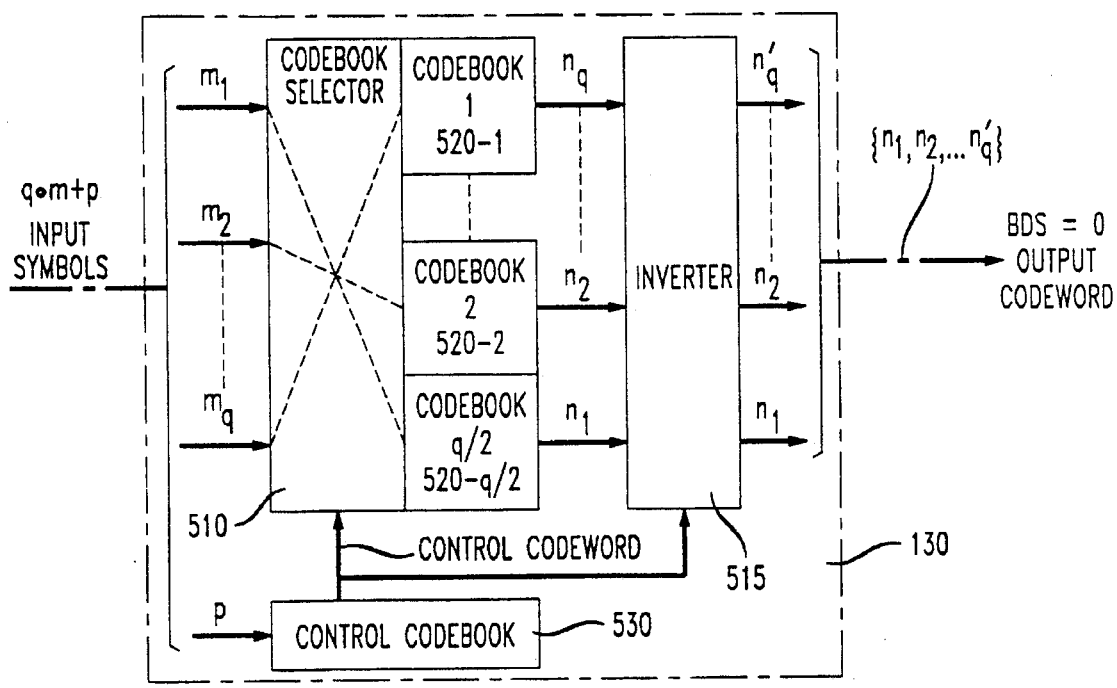
FIG. 5 is a block diagram of a fourth embodiment of a system for generating dc-free sequences.

Another embodiment of the inventive method is illustrated in FIG. 5 in which q groups of m symbols and a group of p symbols are input to modulation coder 130. The group of p symbols are used both to select the codebooks and to determine which codewords are inverted. Each group of m symbols is used to select a codeword from codebook 520-j where the particular codebook selected for a given set of m symbols is determined by the set of p symbols. In particular, the set of p symbols is advantageously used to select a control codeword from control codebook 530 which control codeword is input to codebook selector 510. Codebook selector 510 then routes each set of m symbols to the proper codebook 520-j from which a respective codeword is then selected. The routing is based on a control codeword. The control codeword is selected by applying p input symbols to control codebook 530. The control codewords define sequences with BDS=0. Assuming that each symbol in the sequence is a bipolar symbol (e.g. a +1 or a −1) and that each symbol is associated with a codeword, those codewords associated with a −1 will be inverted and those codewords associated with a +1 will remain unchanged. For example, in FIG. 5, codeword $n_q$ is input to and inverted in inverter 515 and the output is designated $n'_q$.

The embodiment of FIG. 5 uses half as many codebooks as the embodiment of FIG. 4 but requires inverter 515. To illustrate, if codebook 520-1 comprises codewords defining sequences with BDS=3 and codebook 520-2 comprises codewords defining sequences with BDS=1, a dc-free sequence can be generated by selecting a group of 3 codewords from the BDS=1 codebook and second group comprising one codeword from the BDS=3 codebook and inverting symbols in one of the groups. In contrast to a corresponding system using the arrangement of FIG. 4, the system of FIG. 5 eliminates the need for codebooks comprising codewords defining sequences of BDS=−3 and BDS=−1.

Figure 6:
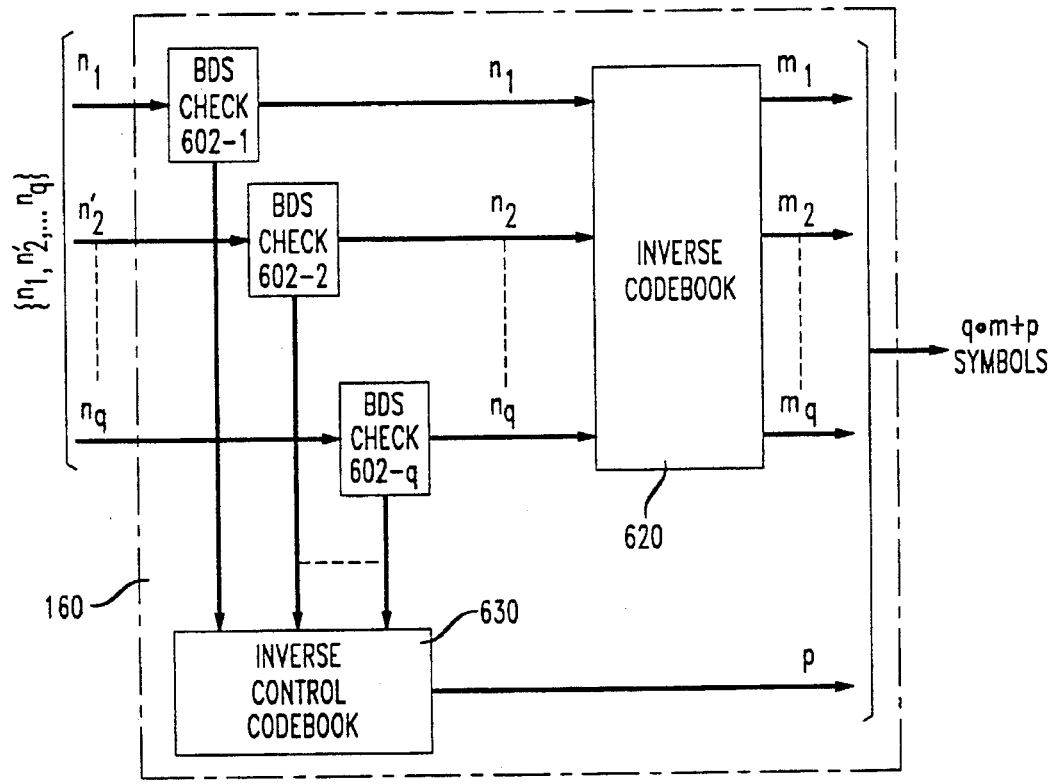
FIG. 6 is a block diagram of a decoding system advantageously used with the system of FIG. 2.

FIG. 6 illustrates a modulation decoder 160 that can be used with the system of FIG. 2. A read or received channel sequence generates a codeword, herein termed an input codeword, which is broken down into q codewords of length n symbols where each codeword defines a portion of the read or received sequence. Let the prime (') designation indicate a codeword defining a portion sequence with a negative BDS, as achieved for example by inverting a sequence with a positive BDS. Assume for illustrative purposes that the received codeword FIG. 6 is $\{n_1, n'_2, \ldots n_q\}$. The BDS for the $j^{th}$ sequence defined by the $j^{th}$ codeword is determined in BDS check 602-j. Assuming the BDS of sequences defined by codewords in codebook 210 of FIG. 2 is x, then codewords defining sequences with BDS=−x in FIG. 6 will have their symbols inverted in BDS check 610-j so that all received codeword will define sequences that have a BDS of x. Each codeword defining the BDS=x sequence will then be input to inverse codebook 620. Inverse codebook 620 outputs, advantageously based on knowledge of codebook 210 of FIG. 2, for each codeword, the m input symbol information word corresponding to the codeword. BDS check 602-j also generates check symbols, depending on whether the BDS of the defined sequences j was +x or −x. The check symbols are input to inverse control codebook 630 to determine, advantageously based on knowledge of control codebook 230, the set of p input symbols used to generate the control codeword in FIG. 2.

Figure 7:
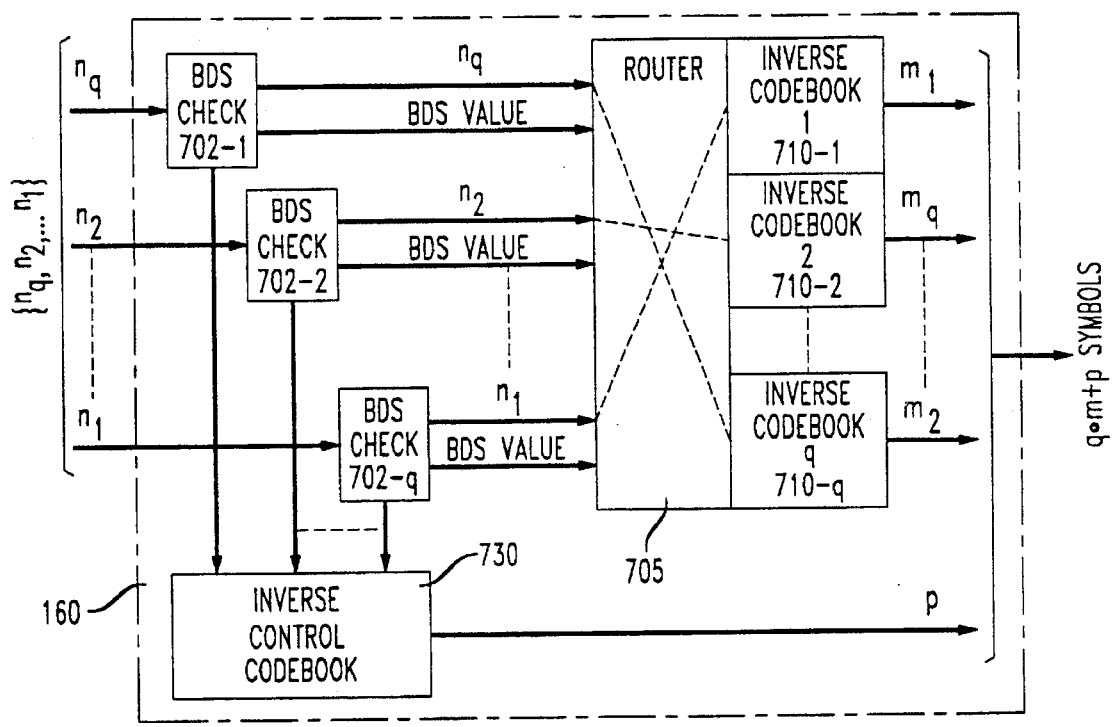
FIG. 7 is a block diagram of a decoding system advantageously used with the system of FIG. 3.

FIG. 7 illustrates a decoding system advantageously used with the system of FIG. 3. A read or received channel sequence generates an input codeword, which is broken down into q codewords of length n symbols where each codeword defines a portion of the read or received sequence. The BDS of each sequence defined by the codewords is determined in BDS check 702-j. The codeword and the BDS value of the corresponding defined sequence are input to router 705. Depending on the BDS value of a defined sequence, router 705 directs the corresponding codeword to one inverse codebook 710-j. Inverse codebook 710-j advantageously operates in a manner similar to inverse codebook 620 of FIG. 6 in that, based on knowledge of codebooks 310-j used to generate the codewords from the information words, the m symbol input information words can be determined. An additional set of p symbols is decoded by receiving from each BDS check 702-j a respective check symbol representing the BDS value of the $j^{th}$ received codeword. These values correspond to symbols in a control codeword and are input to inverse control codebook 730 which, based on knowledge of control codebook 330, can be used to identify the p symbols used to generate the control word that ordered the codewords during the encoding process.

Figure 8:
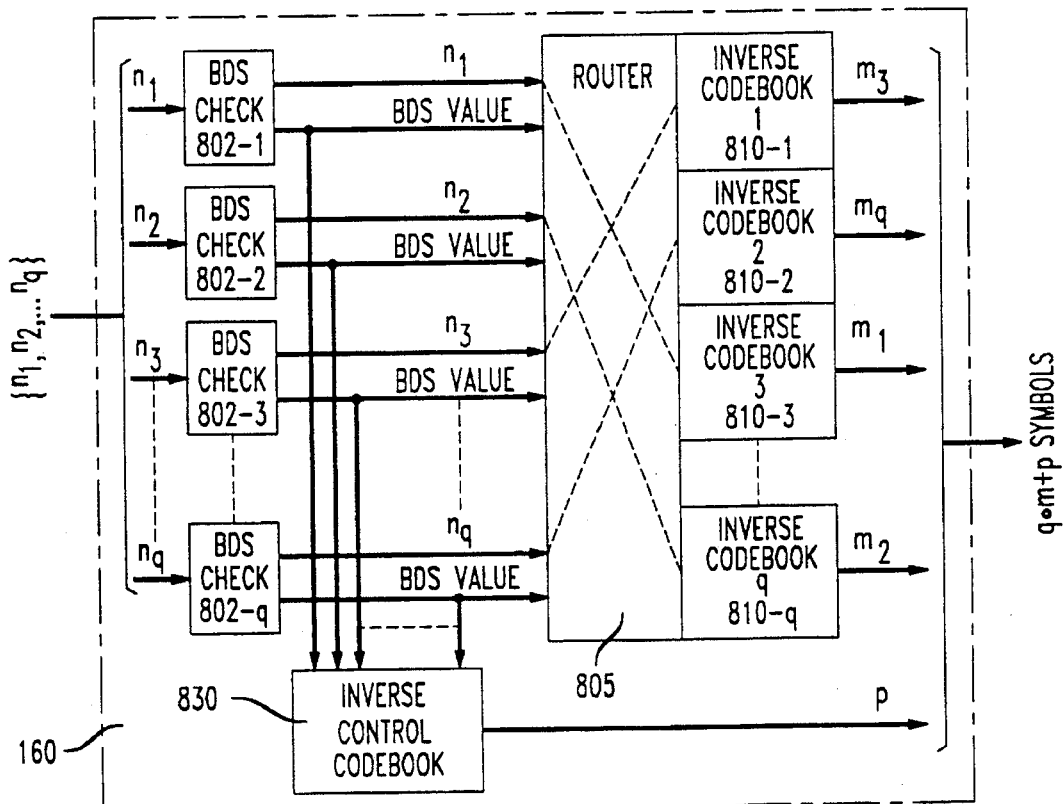
FIG. 8 is a block diagram of a decoding system advantageously used with the system of FIG. 4.

FIG. 8 illustrates a decoding system advantageously used with the system of FIG. 4. A read or received channel sequence generates an input codeword, which is broken down into q codewords of length n symbols where each codeword defines a portion of the read or received sequence. The BDS of the sequence defined by each codeword is determined in BDS check 802-j. The codeword and the BDS value of the corresponding defined sequence are input to router 805 and the codeword is routed to inverse codebook 810-j based on the BDS value of the corresponding sequence. Marcher 810-j generates an m symbol information word advantageously based on knowledge of codebook 420-j. An additional set of p symbols can be determined by receiving from BDS check 802-j the BDS value defined by the $j^{th}$ received codeword. These values correspond to symbols in a control codeword and are input to inverse control codebook 830 which, based on knowledge of control codebook 430, can the generate the p symbols.

Figure 9:
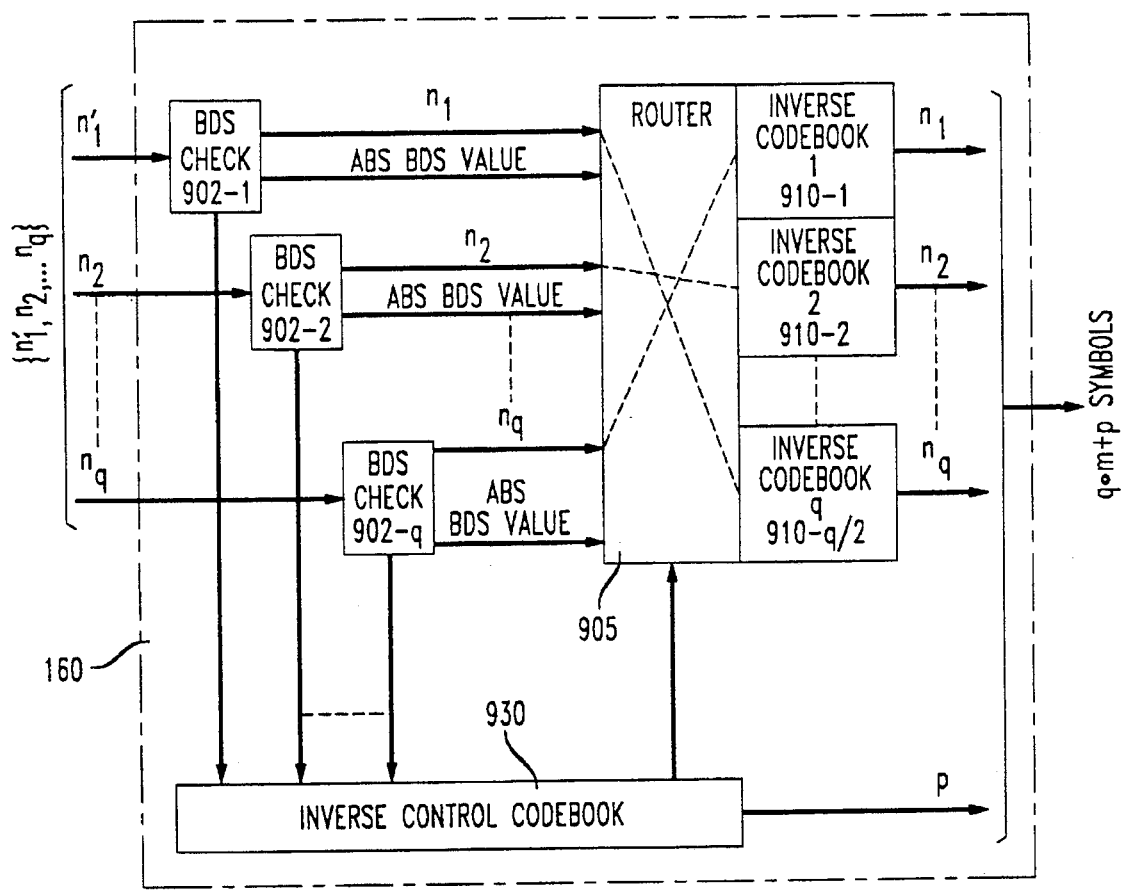
FIG. 9 is a block diagram of a decoding system advantageously used with the system of FIG. 5.

FIG. 9 illustrates a decoding system advantageously used with the system of FIG. 5. A read or received channel sequence generates an input codeword, which is broken down into q codewords of length n symbols where each codeword defines a portion of the read or received sequence. The prime designation (') indicates a sequence where the symbol were inverted. The BDS of each codeword is determined in BDS check 902-j. Codewords defining sequences that were inverted in the encoding process, as evidenced for example by a negative BDS value, are inverted in BDS check 902-j. The additional p information symbols are determined by receiving from BDS check 902-j the BDS value of the $j^{th}$ received codeword. These values correspond to symbols in a control codeword and are input to inverse control codebook 930 which, based on knowledge of control codebook 530, can the generate the p symbols. The codewords and the BDS value are then input into router 905. Router 905 directs the n symbol codeword to inverse codebook 910-i. The routing is advantageously based on the BDS value. Inverse codebook 910-i operates in a fashion similar to the inverse codebooks described above to generate q sets of m information symbols.

This disclosure describes a method and apparatus for modulation encoding. The apparatus and method disclosed herein have been described without reference to specific hardware or software. Instead, the method and apparatus have been described in such a manner that those skilled in the art can readily adapt such hardware and software as may be available or preferable for particular applications. While the above teachings of the present invention have been in terms of modulation coding for a magnetic recording/writing channel, these skilled in the art will recognize the applicability of these teachings to other specific contexts. For example the above teachings are not limited to magnetic recording/writing channels. Likewise, the above teachings are not limited to the particular arrangements shown in the figures above where, for example, the parallel processing of q codewords through q BDS checks could be replaced by serially processing the q codewords through a single BDS check. Further, the above teachings may be extended to include generating output codewords defining sequences having non-zero BDS values which codewords are useful in optical communications.

TABLE 1

| | | | | |
|---|---|---|---|---|
| 1 | 1 | 1 | 1 | |
| 1 | 1 | 1 | −1 | |
| 1 | 1 | −1 | 1 | |
| 1 | 1 | −1 | −1 | * |
| 1 | −1 | 1 | 1 | |
| 1 | −1 | 1 | −1 | * |
| 1 | −1 | −1 | 1 | * |
| 1 | −1 | −1 | −1 | |
| −1 | 1 | 1 | 1 | |
| −1 | 1 | 1 | −1 | * |
| −1 | 1 | −1 | 1 | * |
| −1 | 1 | −1 | −1 | |
| −1 | −1 | 1 | 1 | * |
| −1 | −1 | 1 | −1 | |
| −1 | −1 | −1 | 1 | |
| −1 | −1 | −1 | −1 | |

TABLE 2

| N | R | codebook size |
|---|---|---|
| 2 | 1/2 = .5 | 2 |
| 4 | 2/4 = .5 | 4 |
| 6 | 4/6 = .667 | 16 |
| 8 | 6/8 = .75 | 64 |
| 10 | 7/10 = .70 | 128 |
| 12 | 9/12 = .75 | 512 |
| 14 | 11/14 = .786 | 2048 |
| 16 | 13/16 = .813 | 8192 |

I claim:

1. A method comprising the steps of:

selecting, for each set of input symbols in a plurality of sets of input symbols, a respective codeword, and generating a channel codeword based on the selected respective codewords and on an additional set of input symbols, said channel codeword defining a channel sequence, wherein the block digital sum of the defined channel sequence is zero.

2. The method of claim 1 wherein the step of generating a channel codeword comprises the step of:

ordering said respective codewords based on said additional set of input symbols.

3. The method of claim 2 wherein the step of selecting comprises the steps of, for each set of input symbols:

choosing a codebook from among a plurality of codebooks wherein each codebook in the plurality of codebooks comprises codewords, choosing said respective codeword from among codewords in the selected codebook based on said each set of input symbols.

4. The method of claim 1 wherein the step of generating a channel codeword comprises the steps of:

inverting codeword symbols in particular respective codewords based on said additional set of input symbols.

5. The method of claim 4 wherein, for each set of input symbols, the selected codewords are selected from among codewords in a single codebook.

6. The method of claim 1 wherein said channel codeword is recorded on a magnetic medium.

7. The method of claim 1 wherein said channel codeword is transmitted over a communications channel.

8. A method comprising the steps of:

for each set of input symbols in a plurality of sets of input symbols, selecting a respective codeword from among codewords in a set of one or more codebooks, wherein each respective codeword defines a respective portion of a channel sequence comprising channel symbols, the channel symbols in the respective portions having an associated block digital sum, and wherein the sum of the block digital sums of the respective portions is zero, and generating an channel codeword by concatenating, in an order of concatenation determined by a separate set of input symbols, the respective codewords.

9. The method of claim 8 wherein the step of selecting a respective codeword further comprises the steps of:

selecting, from a first codebook, a first respective codeword for a first set of input symbols, the selecting being based on said first set of input symbols, and selecting, from a second codebook, a second respective codeword for a second set of input symbols, the selecting being based on said second set of input symbols.

10. The method of claim 9 wherein the channel symbols in the respective portion of a channel sequence defined by said first respective codeword has a block digital sum of x, and wherein the channel symbols in the respective portion of a channel sequence defined by said second respective codeword has a block digital sum of −x.

11. The method of claim 10 wherein said different set of input symbols comprises a single bit having a status and where said order of concatenation is indicated by said status.

12. A method comprising the steps of:

for each set of input symbols in a plurality of sets of input symbols, selecting a respective codeword comprising symbols, and inverting codeword symbols in particular respective codewords, the particular respective codewords being selected based on a different set of input symbols, generating a channel codeword based on said codewords, wherein said channel codeword defines a channel sequence comprising channel symbols and wherein the block digital sum of said channel sequence is zero.

13. The method of claim 12 wherein the step of generating comprises the step of:

selecting, based on symbols in said different set of input symbols, a control codeword from a control codebook, the control codeword comprising a number of control symbols equal to the number of respective codewords, each control symbol in the control codebook have a status, and for each respective codeword, inverting the symbols in the selected codeword according to the status of a respective control symbol in said control codebook.

14. The method of claim 13 wherein said control codeword defines a channel sequence with a block digital sum of zero.

15. A method of generating a channel codeword, said channel codeword defining a channel sequence having a block digital sum of a specified value, said method comprising the steps of:

selecting, for each set of input symbols in a plurality of sets of input symbols, a respective codeword, wherein said respective codeword is associated with a respective channel sequence having an associated block digital sum, and generating said channel codeword based on said respective codewords and on said respective block digital sums, wherein said channel sequence defined by said channel codeword has a block digital sum equal to said specified value.

16. The method of claim 15 wherein said specified value is zero.

17. The method of claim 15 wherein the step of selecting comprises the step of:

for each set of input symbols, choosing a codeword from a codebook as said respective codeword.

18. The method of claim 17 wherein the step of choosing comprises the step of:

selecting, according to a first other set of input symbols, a codebook from among a plurality of codebooks, each codebook in said plurality of codebooks comprising codewords, wherein the chosen codeword is selected from among codewords in the chosen codebook.

19. The method of claim 15 or 18 wherein the step of generating comprises:

ordering said respective codewords based on a second other set of input symbols.

20. The method of claim 15 or 18 wherein each respective codeword comprises symbols and wherein the step of generating comprises:

inverting symbols in particular respective codewords based on a second other set of input symbols.

21. The method of claim 19 wherein the step of ordering comprises the steps of:

selecting, based on said second other set of input symbols, a control codeword, said control codeword comprising control symbols, wherein a channel sequence defined by said control codeword has a block digital sum of zero, and ordering said respective codewords based on the control symbols in said selected control codeword.

22. The method of claim 20 wherein the step of inverting comprises the steps of:

selecting, based on said second other set of input symbols, a control codeword, said control codeword comprising control symbols, wherein a channel sequence defined by said control codeword has a block digital sum of zero, and inverting symbols in said respective codewords based on said control symbols in said selected control codeword.

23. The method of claim 16 further comprising the step of:

recording said defined channel sequence on a magnetic medium.

24. The method of claim 16 further comprising the step of:

transmitting said defined channel sequence over a communications channel.

25. A method comprising the steps of:

for each portion in a plurality of portions of an input codeword, wherein each portion defines a corresponding portion of a channel sequence comprising channel symbols, wherein each portion of said input codeword comprises symbols, generating a respective set of output symbols, and generating, based on the block digital sum of the channel symbols in the portion of the channel sequence corresponding to each portion of said input codeword, an additional set of output symbols.

26. The method of claim 25 wherein the step of generating a respective set of output symbols comprises the step of:

selecting for each portion of said input codeword, based on the symbols in said each portion, an entry from among one or more entries in a codebook, the selected entry comprising said respective set of output symbols.

27. The method of claim 26 wherein the step of selecting an entry comprises the step of:

selecting, based on the block digital sum of channel symbols in the channel sequence corresponding to said portion, said codebook from among a plurality of codebooks.

28. The method of claim 26 further comprising the step of:

for portions of said channels sequence having a negative block digital sum, inverting symbols in corresponding portions in said input codeword.

29. The method of claim 25 wherein said input codeword is received over a communications channel.

30. The method of claim 25 wherein said input codeword is read from a magnetic recording channel.

31. The method of claim 25 wherein the block digital sum of said portions of said channel sequences corresponding to said portions in said input codeword is zero.

32. The method of claim 25 wherein said input codeword comprises a first portion defining a first portion of said channel sequence wherein the block digital sum of said first portion of said channel sequence is x and wherein said input codeword comprises a second portion defining a second portion of said channel sequence wherein the block digital sum of said second portion of said channel sequence is $-x$.

33. An apparatus for generating a channel codeword, said channel codeword defining a channel sequence having a block digital sum of a specified value, said apparatus comprising:

means for selecting, for each set of input symbols in a plurality of sets of input symbols, a respective codeword, wherein said respective codeword is associated with a respective channel sequence having an associated block digital sum, and means for generating said channel codeword based on said respective codewords and on said respective block digital sums, wherein said channel sequence defined by said channel codeword has a block digital sum equal to said specified value.

34. The apparatus of claim 33 wherein said specified value is zero.

35. The apparatus of claim 33 wherein the means for selecting comprises:

means for choosing, for each set of input symbols, a codeword from a codebook as said respective codeword.

36. The apparatus of claim 35 wherein the means for choosing comprises:

means for selecting, according to a first other set of input symbols, a codebook from among a plurality of codebooks, each codebook in said plurality of codebooks comprising codewords, wherein the chosen codeword is selected from among codewords in the chosen codebook.

37. The apparatus of claim 33 or 36 wherein the means for generating comprises:

means for ordering said respective codewords based on a second other set of input symbols.

38. The apparatus of claim 33 or 36 wherein each respective codeword comprises symbols and wherein the means for generating comprises:

means for inverting symbols in particular respective codewords based on a second other set of input symbols.

39. The apparatus of claim 37 wherein the means for ordering comprises:

means for selecting, based on said second other set of input symbols, a control codeword, said control codeword comprising control symbols, wherein a channel sequence defined by said control codeword has a block digital sum of zero, and means for ordering said respective codewords based on the control symbols in said selected control codeword.

40. The apparatus of claim 38 wherein the means for inverting comprises:

means for selecting, based on said second other set of input symbols, a control codeword, said control codeword comprising control symbols, wherein a channel sequence defined by said control codeword has a block digital sum of zero, and means for inverting symbols in said respective codewords based on said control symbols in said selected control codeword.

41. The apparatus of claim 34 further comprising:

means for recording said defined channel sequence on a magnetic medium.

42. The apparatus of claim 34 further comprising:

means for transmitting said defined channel sequence over a communications channel.

43. An apparatus comprising for each portion in a plurality of portions of an input codeword, wherein each portion defines a corresponding portion of a channel sequence comprising channel symbols, wherein each portion of said input codeword comprises symbols, means for generating a respective set of output symbols, and means for generating, based on the block digital sum of the channel symbols in the portion of the channel sequence corresponding to each portion of said input codeword, an additional set of output symbols.

44. The apparatus of claim 43 wherein the means for generating a respective set of output symbols comprises:

means for selecting for each portion of said input codeword, based on the symbols in said each portion, an entry from among one or more entries in a codebook, the selected entry comprising said respective set of output symbols.

45. The apparatus of claim 44 wherein the means for selecting an entry comprises:

means for selecting, based on the block digital sum of channel symbols in the channel sequence corresponding to said portion, said codebook from among a plurality of codebooks.

46. The apparatus of claim 44 further comprising:

for portions of said channels sequence having a negative block digital sum, means for inverting symbols in corresponding portions in said input codeword.

47. The apparatus of claim 43 wherein said input codeword is received over a communications channel.

48. The method of claim 43 wherein said input codeword is read from a magnetic recording channel.

49. The apparatus of claim 43 wherein the block digital sum of said portions of said channel sequences corresponding to said portions in said input codeword is zero.

50. The apparatus of claim 43 wherein said input codeword comprises a first portion defining a first portion of said channel sequence wherein the block digital sum of said first portion of said channel sequence is x and wherein said input codeword comprises a second portion defining a second portion of said channel sequence wherein the block digital sum of said second portion of said channel sequence is −x.

* * * * *